(12) United States Patent
Mahon et al.

(10) Patent No.: US 11,424,196 B2
(45) Date of Patent: Aug. 23, 2022

(54) MATCHING CIRCUIT FOR INTEGRATED CIRCUIT DIE

(71) Applicant: ANALOG DEVICES, INC., Norwood, MA (US)

(72) Inventors: John C. Mahon, Merrimack, NH (US); Peter J. Katzin, Arlington, MA (US); Song Lin, Burlington, MA (US)

(73) Assignee: Analog Devices, Inc., Norwood, MA (US)

( * ) Notice: Subject to any disclaimer, the term of this patent is extended or adjusted under 35 U.S.C. 154(b) by 193 days.

(21) Appl. No.: 16/282,148

(22) Filed: Feb. 21, 2019

(65) Prior Publication Data

US 2019/0371746 A1  Dec. 5, 2019

Related U.S. Application Data

(60) Provisional application No. 62/679,616, filed on Jun. 1, 2018.

(51) Int. Cl.
*H01L 23/66* (2006.01)
*H01L 23/48* (2006.01)
*H03H 7/38* (2006.01)
*H01L 23/00* (2006.01)

(52) U.S. Cl.
CPC ............ *H01L 23/66* (2013.01); *H01L 23/481* (2013.01); *H03H 7/38* (2013.01); *H01L 24/32* (2013.01); *H01L 2223/6655* (2013.01); *H01L 2223/6672* (2013.01); *H01L 2223/6683* (2013.01); *H01L 2224/32227* (2013.01)

(58) Field of Classification Search
CPC ....... H01L 23/66; H01L 23/481; H01L 24/32; H01L 2223/6655; H01L 2223/6672; H01L 2223/6683; H01L 2224/32227; H03H 7/38
See application file for complete search history.

(56) References Cited

U.S. PATENT DOCUMENTS

| | | |
|---|---|---|
| 4,841,101 A | 6/1989 | Pollock |
| 5,223,672 A | 6/1993 | Pinneo et al. |
| 5,523,622 A | 6/1996 | Harada et al. |
| 5,819,401 A | 10/1998 | Johannes et al. |
| 5,994,975 A | 11/1999 | Allen et al. |

(Continued)

FOREIGN PATENT DOCUMENTS

DE     20 2014 104 574 U    11/2014

OTHER PUBLICATIONS

U.S. Appl. No. 16/421,221, filed May 23, 2019, Wilcox.

(Continued)

*Primary Examiner* — Peter Bradford
(74) *Attorney, Agent, or Firm* — Knobbe Martens Olson & Bear LLP

(57) ABSTRACT

An integrated circuit (IC) die is disclosed. The IC die can include a signal via extending through the IC die. The IC die can include a transmission line extending laterally within the IC die in a direction non-parallel to the signal via, the transmission line configured to transfer an electrical signal to the signal via. The IC die can include a matching circuit disposed between the transmission line and the signal via. The matching circuit can include inductance and capacitance matching circuitry to compensate for parasitic inductance and capacitance introduced by transition from the IC die to an underlying carrier.

15 Claims, 8 Drawing Sheets

(56) References Cited

U.S. PATENT DOCUMENTS

| | | | |
|---|---|---|---|
| 6,111,198 A | 8/2000 | Tower | |
| 6,423,575 B1 | 7/2002 | Tran et al. | |
| 6,455,880 B1 | 9/2002 | Ono et al. | |
| 6,680,544 B2 | 1/2004 | Lu et al. | |
| 6,841,731 B1 | 1/2005 | Zanello | |
| 6,844,502 B2 | 1/2005 | Deng et al. | |
| 6,900,533 B2 | 5/2005 | Burton | |
| 7,412,172 B2* | 8/2008 | Kuchta | H01P 5/02 |
| | | | 398/135 |
| 7,444,734 B2 | 11/2008 | Gaucher et al. | |
| 7,732,913 B2 | 9/2010 | Hsieh et al. | |
| 7,968,978 B2 | 6/2011 | Adlerstein et al. | |
| 8,119,931 B1 | 2/2012 | Liu | |
| 8,153,449 B2 | 4/2012 | Adlerstein et al. | |
| 8,618,629 B2 | 12/2013 | Kim et al. | |
| 8,773,204 B2 | 7/2014 | Cabanillas et al. | |
| 9,048,232 B2 | 6/2015 | Colussi et al. | |
| 9,059,490 B2 | 6/2015 | DeVries et al. | |
| 9,245,835 B1 | 1/2016 | Jiang et al. | |
| 9,437,558 B2 | 9/2016 | Pye et al. | |
| 9,577,416 B2 | 2/2017 | Nisslbeck et al. | |
| 9,666,544 B2 | 5/2017 | Zu et al. | |
| 9,711,465 B2 | 7/2017 | Liao et al. | |
| 9,812,379 B1 | 11/2017 | Chiu et al. | |
| 10,945,337 B2 | 3/2021 | Ikeda et al. | |
| 2004/0227583 A1* | 11/2004 | Shaffner | H01P 1/127 |
| | | | 333/32 |
| 2008/0100394 A1 | 5/2008 | Margomenos et al. | |
| 2009/0057872 A1* | 3/2009 | Ehlers | H01L 24/06 |
| | | | 257/698 |
| 2009/0102740 A1 | 4/2009 | Rofougaran | |
| 2010/0200968 A1 | 8/2010 | Purden et al. | |
| 2010/0232480 A1 | 9/2010 | Bhandal et al. | |
| 2010/0321129 A1* | 12/2010 | Onody | H03F 1/56 |
| | | | 333/124 |
| 2011/0084358 A1 | 4/2011 | Kim et al. | |
| 2011/0223692 A1 | 9/2011 | Adlerstein et al. | |
| 2012/0062332 A1 | 3/2012 | Nagai et al. | |
| 2012/0193771 A1 | 8/2012 | Masuda | |
| 2013/0015467 A1 | 1/2013 | Krumbein et al. | |
| 2013/0256849 A1* | 10/2013 | Danny | H01P 5/107 |
| | | | 257/664 |
| 2013/0256850 A1 | 10/2013 | Danny et al. | |
| 2014/0118084 A1* | 5/2014 | Takemura | H03H 9/1092 |
| | | | 333/133 |
| 2014/0300003 A1 | 10/2014 | Kariyazaki et al. | |
| 2015/0042417 A1 | 2/2015 | Onodera et al. | |
| 2015/0097633 A1 | 4/2015 | DeVries et al. | |
| 2016/0126920 A1 | 5/2016 | Kaper | |
| 2016/0181211 A1 | 6/2016 | Kamgaing et al. | |
| 2016/0343653 A1 | 11/2016 | Huang et al. | |
| 2016/0344084 A1 | 11/2016 | Ghassemi et al. | |
| 2017/0077896 A1* | 3/2017 | Sugaya | H03H 7/0138 |
| 2017/0111078 A1 | 4/2017 | Onodera et al. | |
| 2017/0179050 A1 | 6/2017 | Kariyazaki | |
| 2017/0268827 A1 | 9/2017 | Kaminski et al. | |
| 2018/0012834 A1 | 1/2018 | Wang et al. | |
| 2018/0034421 A1 | 2/2018 | Abdo et al. | |
| 2018/0122747 A1 | 5/2018 | Sun et al. | |
| 2019/0267361 A1* | 8/2019 | Rahim | H01L 23/66 |
| 2019/0295966 A1 | 9/2019 | Kong | |
| 2019/0371747 A1 | 12/2019 | Wilcox | |
| 2020/0168567 A1 | 5/2020 | Lin | |
| 2020/0375049 A1 | 11/2020 | Winter et al. | |

OTHER PUBLICATIONS

U.S. Appl. No. 16/282,170, filed Feb. 21, 2019, Lin.

Extended European Search Report issued in application No. 19176598.1 dated Oct. 4, 2019.

Alléaume, PF et al., "Millimetre-wave hot-via interconnect-based GaAs chip-set for automotive RADAR and security sensors," Proceedings of the 3rd European Microwave Integrated Circuits Conference, Oct. 2008, Amsterdam, The Netherlands, pp. 52-55.

Bessemoulin, A. et al., "A chip-scale packaged amplifier MMIC using broadband hot-via-transitions," 11th GAAS Symposium, Munich 2003, pp. 415-418.

Bessemoulin, A., "Design data for hot-via interconnects in chip scale packaged MMICs up to 110 GHz," 12th GAAS Symposium, Amsterdam 2004, pp. 495-498.

Bessemoulin, A. et al., "Hot-via interconnects: A step toward surface mount chip scale packaged MMICs up to 110 GHz," IEEE CSIC Digest, 2004, pp. 237-240.

Bessemoulin, A. et al., "Soldered hot-via E-band and W-band power amplifier MMICs for millimeter-wave chip scale packaging," IEEE, 2016, pp. 1-4.

Kazior, T.E. et al., "DBIT—Direct Backside Interconnect Technology: A manufacturable, bond wire free interconnect technology for microwave and millimeter wave MMICs," IEEE MTT-S Digest, 1997, pp. 723-726.

Lin, H.T. et al., "6 inch 0.1 μm GaAs pHEMT technology for E/V/band application," CS MANTECH Conference, May 16-19, 2011, Palm Springs, CA, pp. 1-3.

Lin. S. et al., "Development of an ultra-wideband suspended stripline to shielded microstrip transition,." IEEE Microwave and Wireless Components Letters, Sep. 2011, vol. 21, No. 9. pp. 474-476.

Schmückle, F.J. et al., "40 GHz hot-via flip-chip interconnects," IEEE MTT-S Digest, 2003, pp. 1167-1170.

Zhou, J. et al., "3D heterogeneous integration technology using hot via MMIC and silicon interposer with millimeter wave application," IEEE, 2017, pp. 499-502.

Stratix 10 Devices, High Speed Signal Interface Layout Design Guideline, Intel, Nov. 11, 2016, pp. 1-88.

* cited by examiner

US 11,424,196 B2

1

MATCHING CIRCUIT FOR INTEGRATED CIRCUIT DIE

CROSS-REFERENCE TO RELATED APPLICATIONS

This application claims priority to U.S. Provisional Patent Application No. 62/679,616, filed Jun. 1, 2018, the entire contents of which are incorporated by reference herein for all purposes.

BACKGROUND

Field

The field relates to a matching circuit for an integrated circuit (IC) die, and in particular, to a matching circuit for high frequency IC dies.

Description of the Related Art

High frequency integrated circuit (IC) dies (e.g., microwave or millimeter-wave integrated circuits, or MMICs) are often mounted to a package substrate and electrically connected to the package substrate by wire or ribbon bonds. However, the use of wire or ribbon bonds at high operating frequencies induces variable parasitic inductance that may significantly limit the high frequency performance and bandwidth of the IC die. Accordingly, there remains a continuing need for improved high frequency IC dies.

SUMMARY

In one embodiment, an integrated circuit (IC) die having a first side and a second side opposite the first side is disclosed. The IC die can include a signal via through the IC die. The IC die can include a transmission line disposed at or near the first side of the IC die, the transmission line configured to transfer an electrical signal to the signal via. The IC die can include a matching circuit disposed at or near the first side within the IC die and providing electrical communication between the transmission line and the signal via.

In another embodiment, an integrated circuit (IC) die is disclosed. The IC die can include a signal via extending through the IC die. The IC die can include a transmission line extending laterally within the IC die in a direction non-parallel to the signal via, the transmission line configured to transfer an electrical signal to the signal via. The IC die can include a matching circuit disposed between the transmission line and the signal via.

In another embodiment, an integrated circuit (IC) is disclosed. The IC package can include a package substrate and an IC die mounted to the package substrate. The IC die can comprise a signal via extending through the IC die and a matching circuit disposed within the IC die and providing electrical communication between circuitry in the IC die and the signal via.

2

Figure 2A:
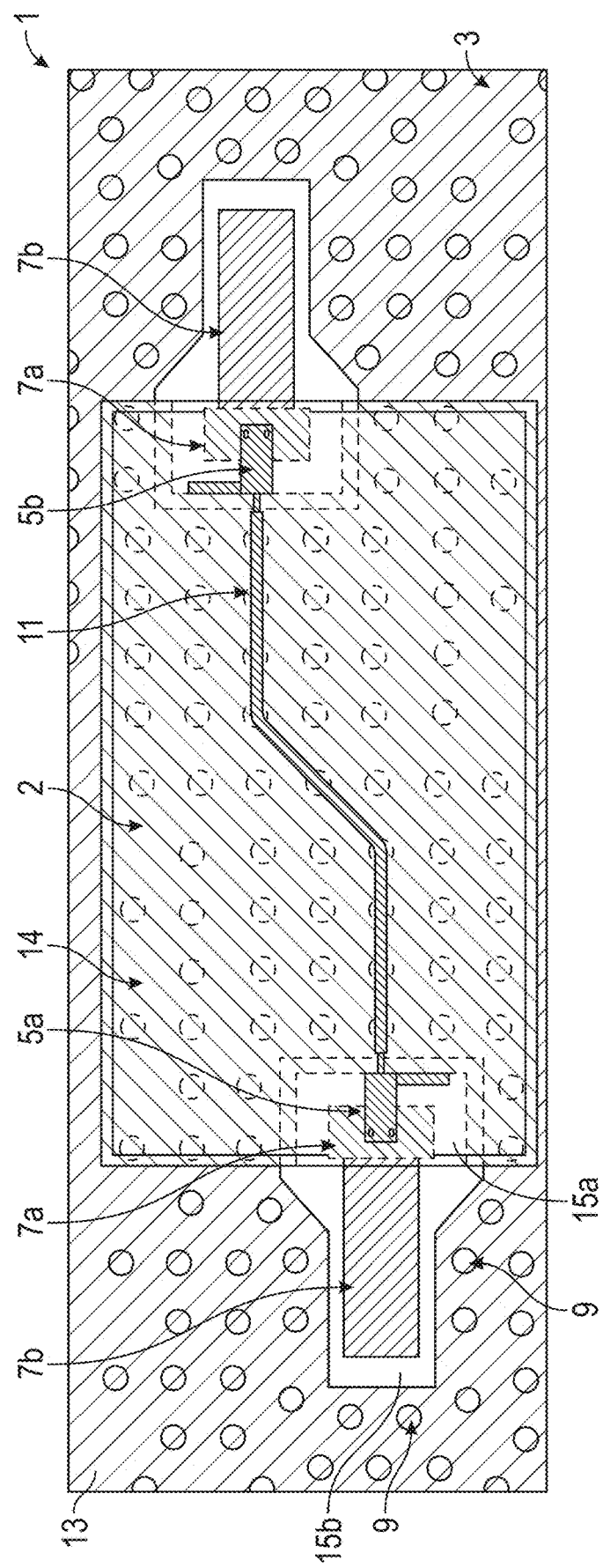
FIG. 2A is a schematic, partially transparent top view of a portion of the IC package of FIG. 1.
Figure 2B:
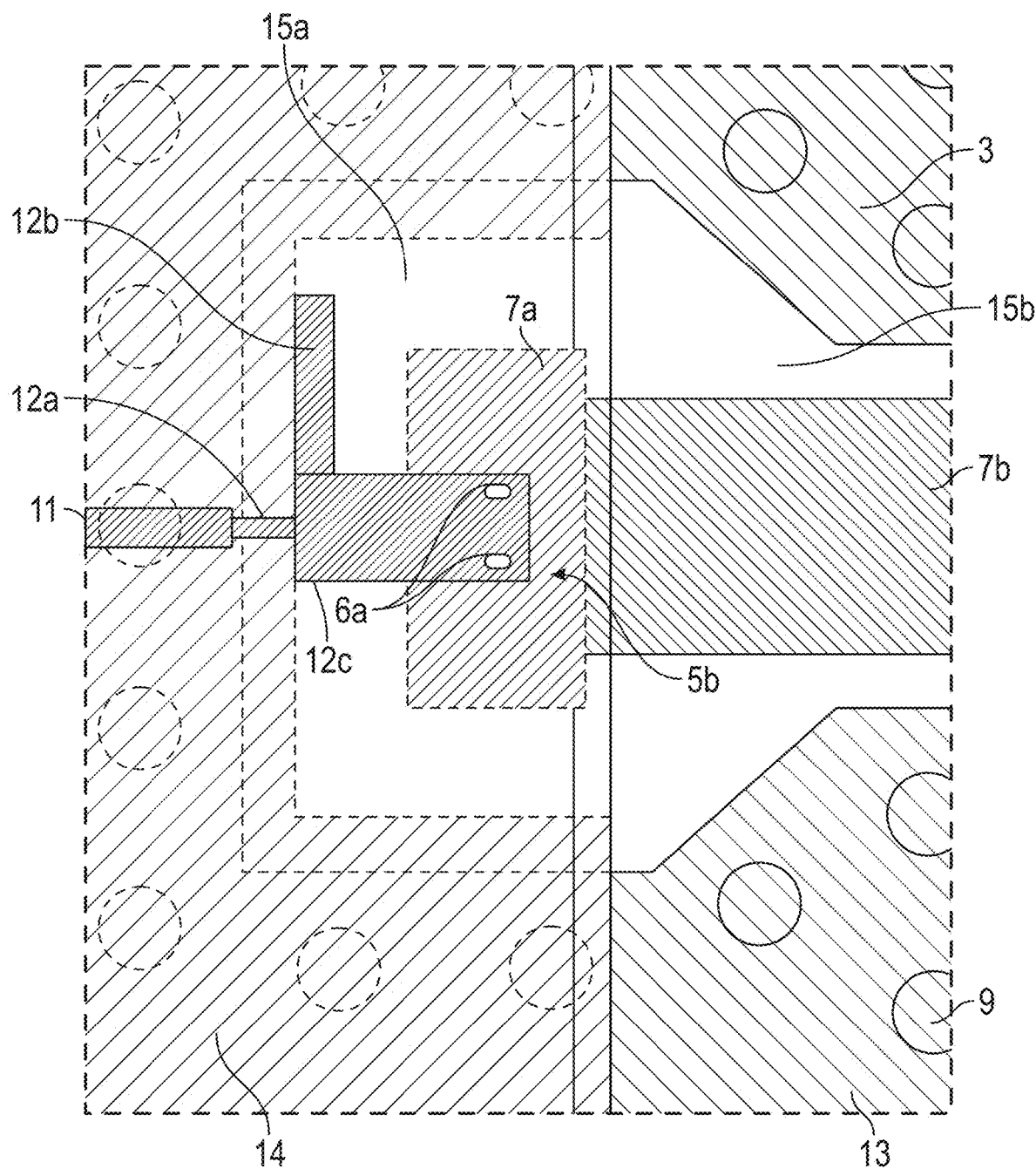

FIG. 2B is an enlarged view of the package of a portion of FIG. 2A that illustrates an example matching circuit according to various embodiments.

Figure 2C:
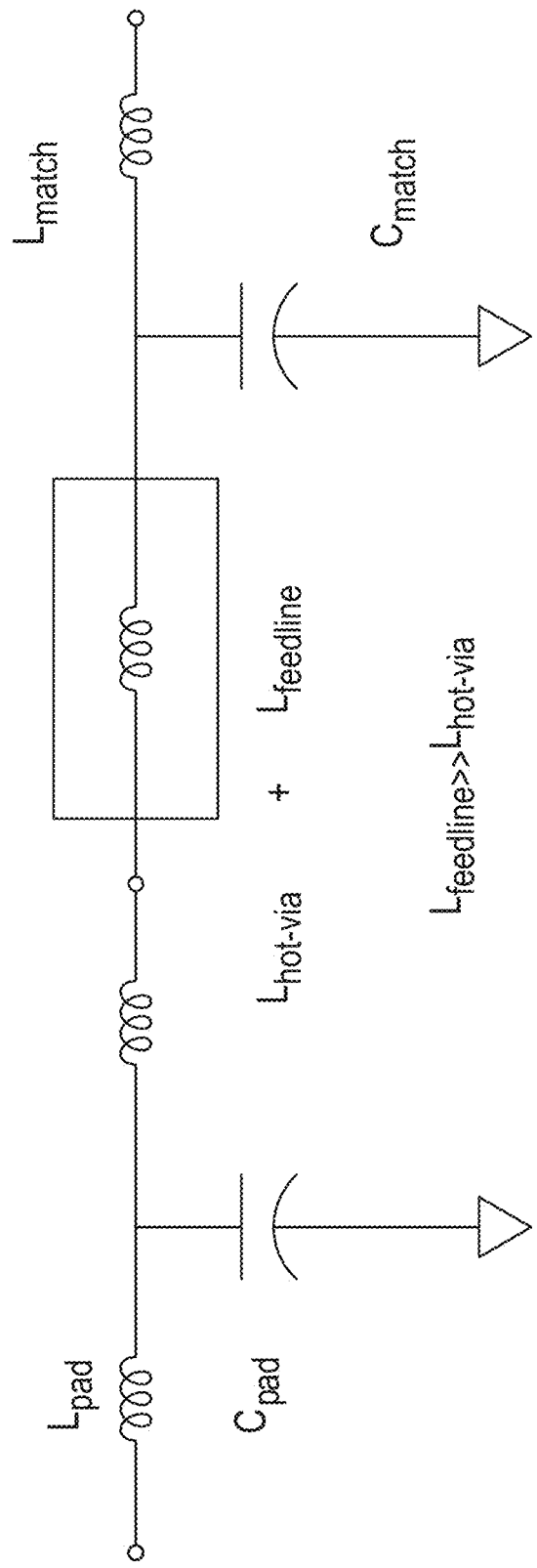

FIG. 2C is a schematic circuit diagram illustrating a model of the example matching circuit of FIG. 2B.

Figure 3A:
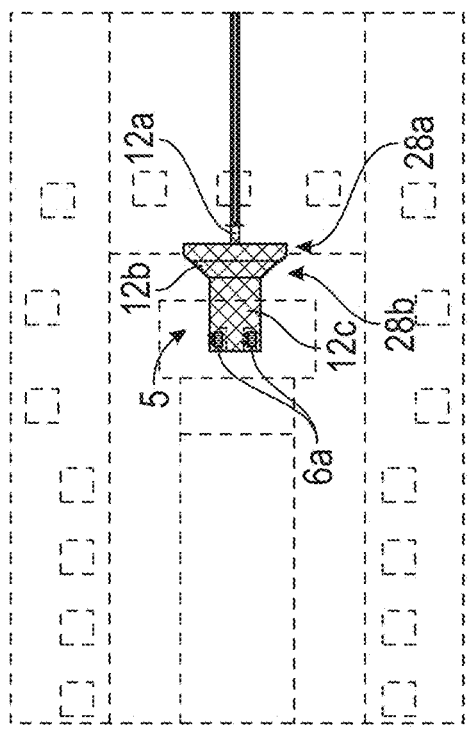

FIG. 3A is a top plan view of the matching circuit, shown at the top side of the die and over the package substrate.

Figure 3B:
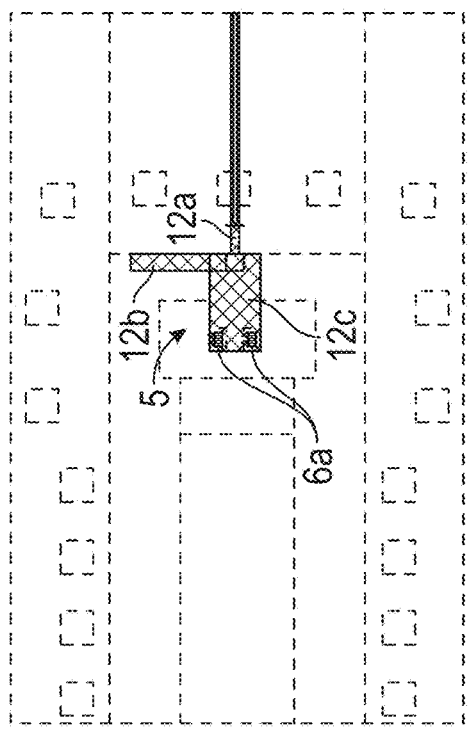

FIG. 3B is a top plan view of a matching circuit, according to another embodiment.

Figure 3C:
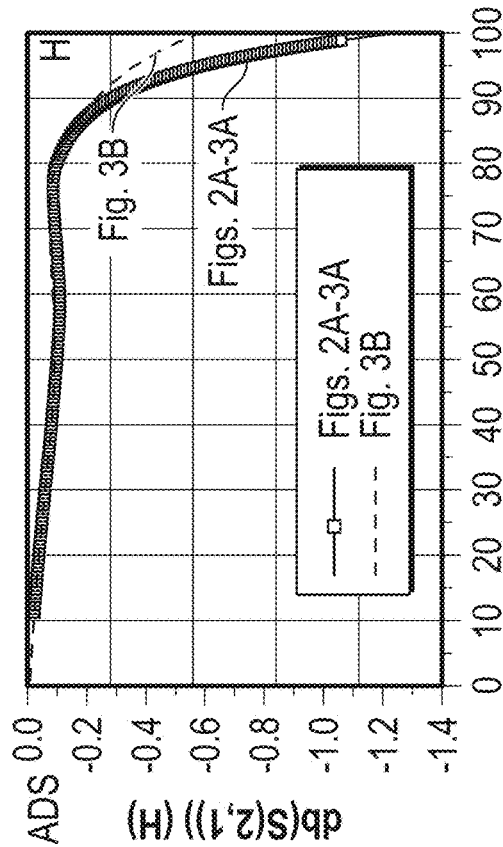
Figure 3D:
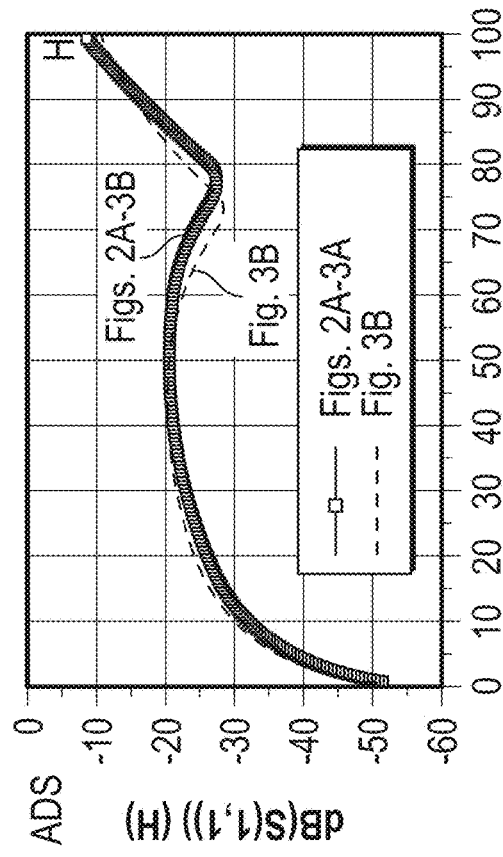

FIGS. 3C and 3D are graphs illustrating the electrical performance of the matching circuit of FIGS. 2A-3A and of the matching circuit of FIG. 3B.

Figure 4A:
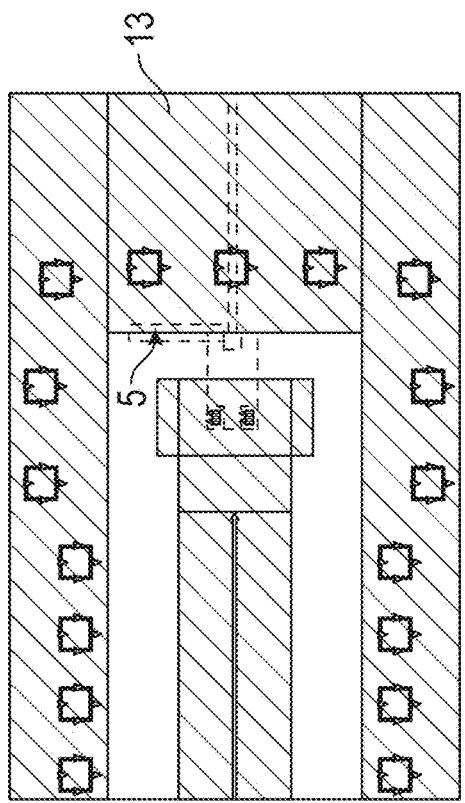

FIG. 4A is a top plan view of the matching circuit shown in FIG. 3A.

Figure 4B:
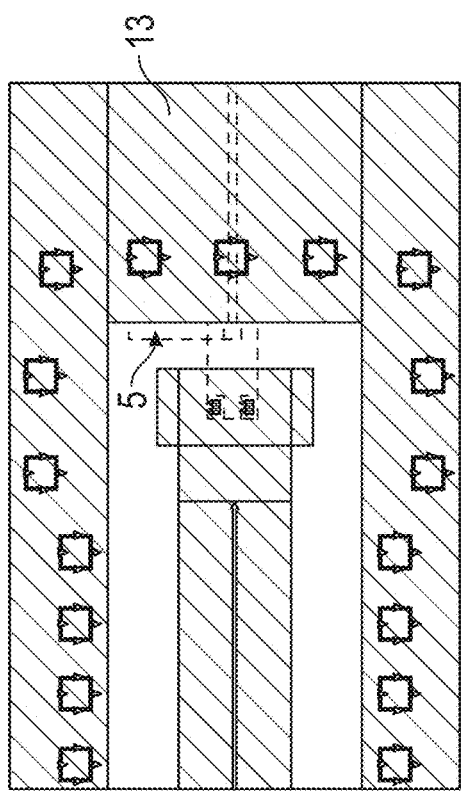

FIG. 4B is a top plan view of the matching circuit shown in FIG. 4A, but where the die is slightly misaligned and offset laterally relative to a ground plane of a package substrate.

Figure 4C:
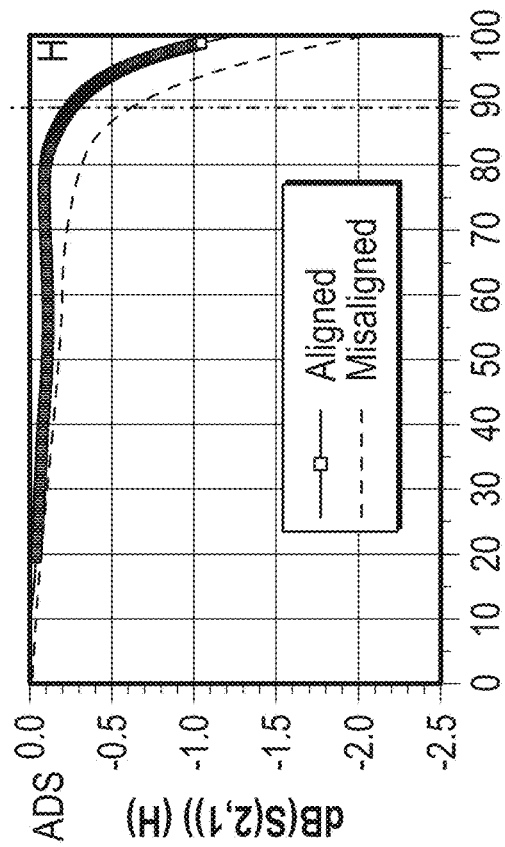

FIG. 4C is a graph illustrating the return loss of the matching circuit of FIGS. 4A-4B for aligned and misaligned configurations.

Figure 4D:
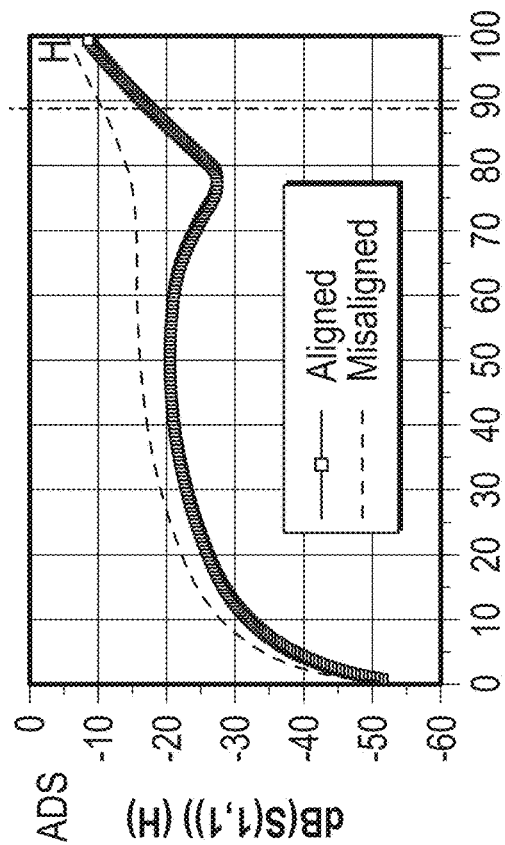

FIG. 4D is a graph illustrating the insertion loss of the matching circuit of FIGS. 4A-4B for aligned and misaligned configurations.

Figure 5A:
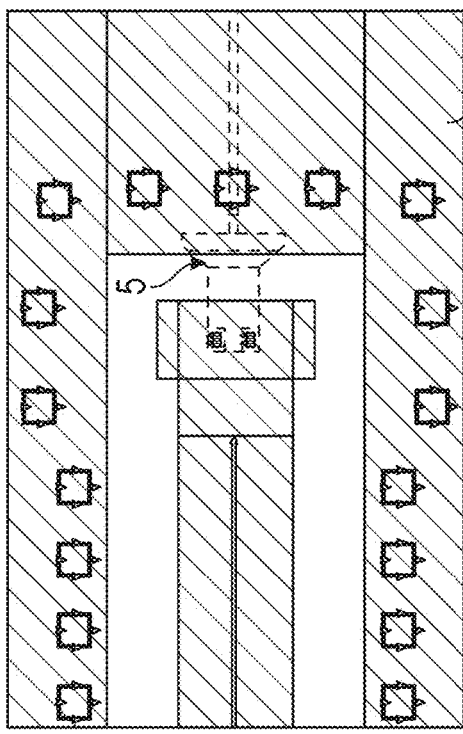

FIG. 5A is a top plan view of the matching circuit shown in FIG. 3B, with the matching circuit shown in phantom.

Figure 5C:
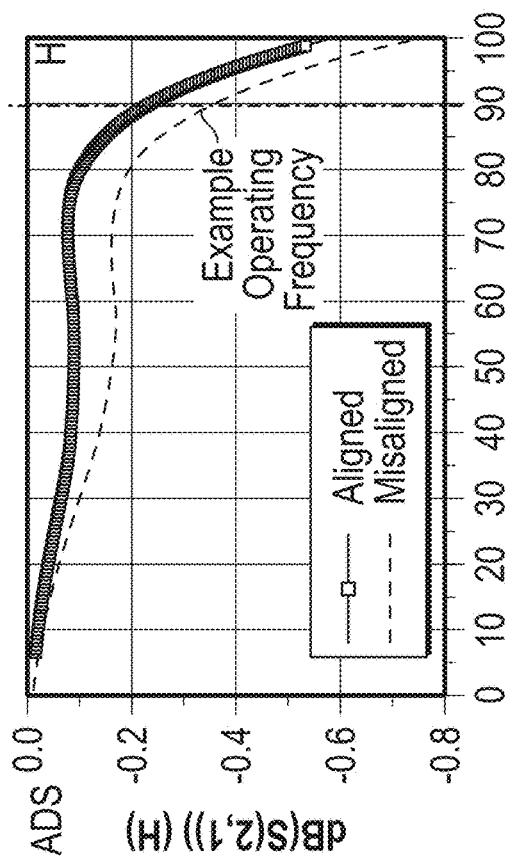
Figure 5B:
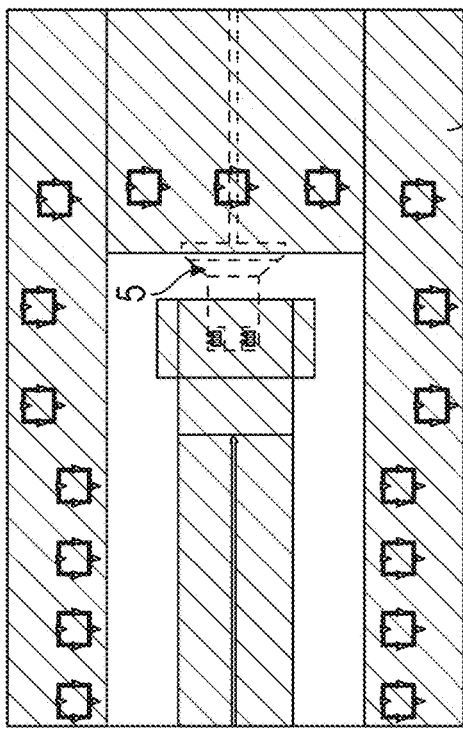

FIG. 5B is a top plan view of the matching circuit shown in FIG. 5A, but slightly misaligned and offset laterally relative to the ground plane of the package substrate.

FIG. 5C is a graph illustrating the return loss of the matching circuit of FIGS. 5A-5B for aligned and misaligned configurations.

Figure 5D:
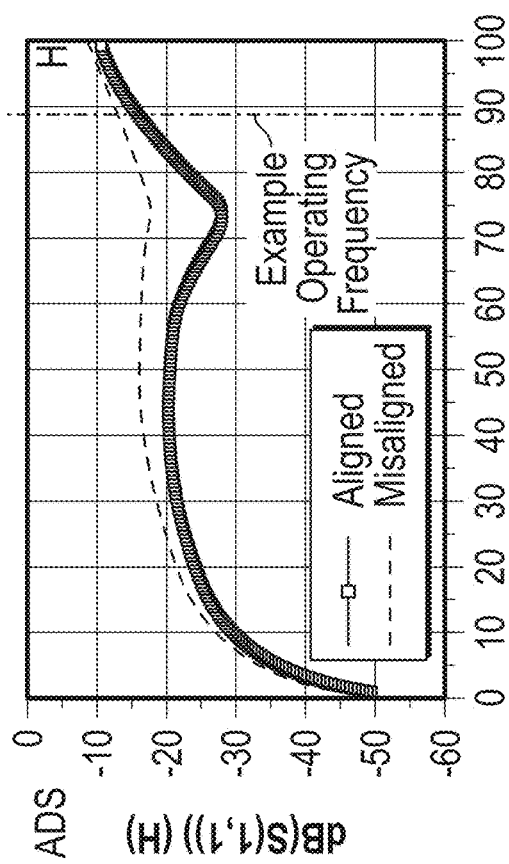

FIG. 5D is a graph illustrating the insertion loss of the matching circuit of FIGS. 5A-5B for aligned and misaligned configurations.

Figure 6B:
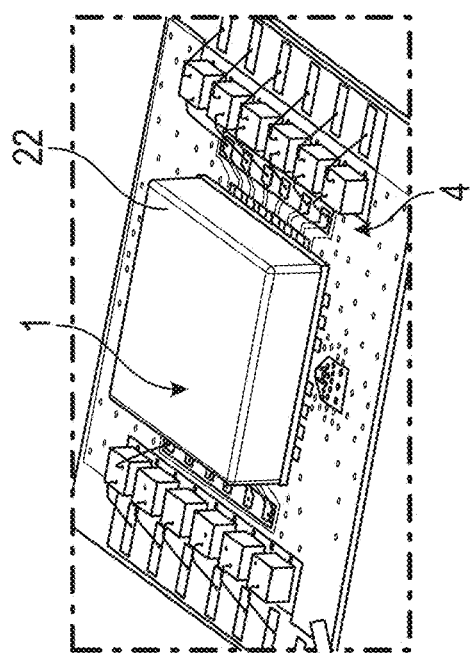
Figure 6C:
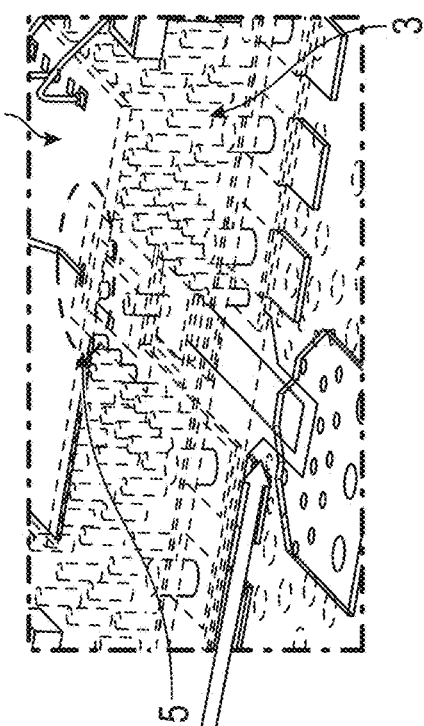
Figure 6A:
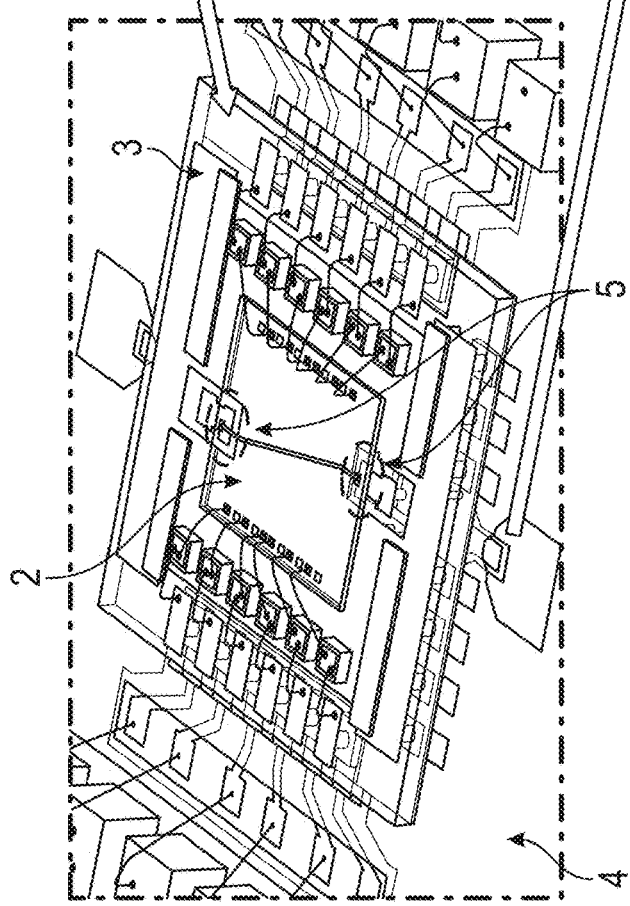

FIG. 6A is a schematic perspective view of an IC die mounted to a package substrate, which is mounted to a carrier.

FIG. 6B is a schematic perspective view of a package mounted to the carrier.

FIG. 6C is a schematic perspective view (shown transparent) illustrating the die mounted to the package substrate.

DETAILED DESCRIPTION

Figure 1:
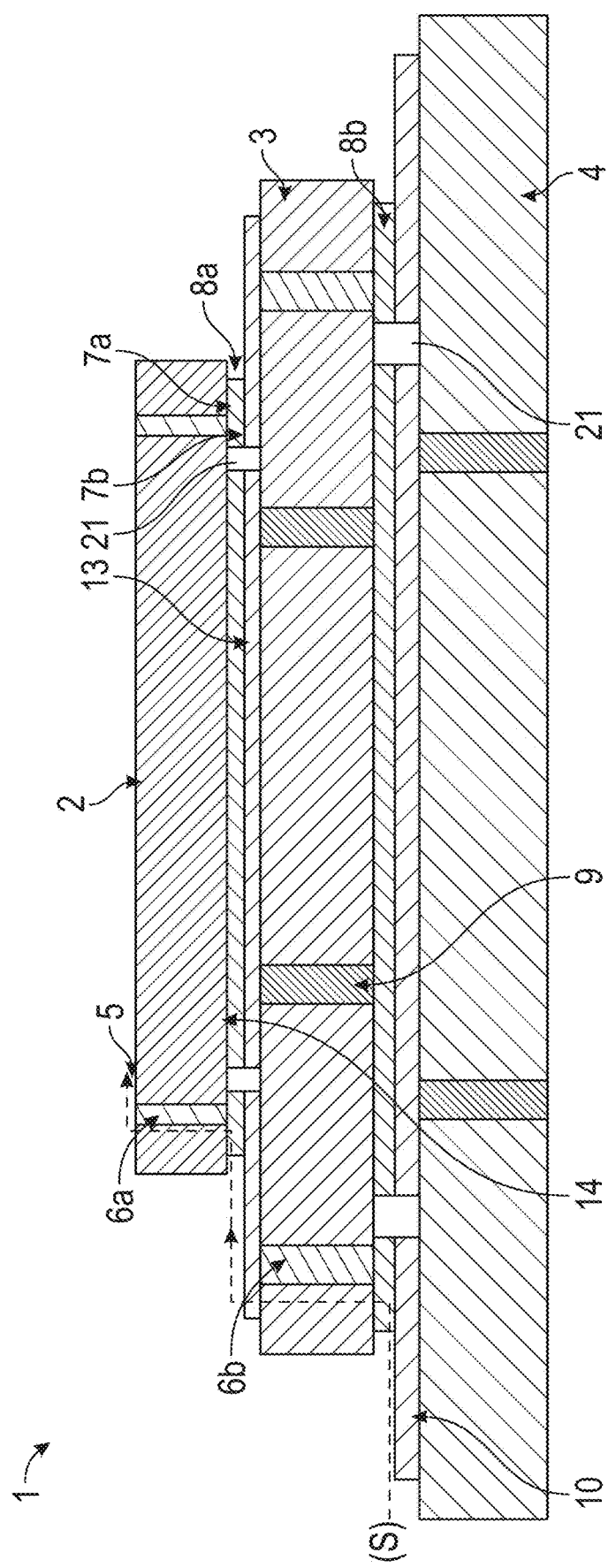
FIG. 1 is a schematic side sectional view of an integrated circuit (IC) package, according to various embodiments.

Various embodiments disclosed herein relate to high frequency IC dies and packages therefor. FIG. 1 is a schematic side sectional view of an integrated circuit (IC) package 1, according to various embodiments. The package 1 can comprise an IC die 2 mounted to a package substrate 3 by way of an adhesive 8a. The IC die 2 can comprise circuitry (e.g., transmission lines, active circuits, etc.) at or near a top side of the die 2. Further, the die 2 can comprise die ground metallization 14 configured to connect to the package substrate 3. In some embodiments, portions of the die ground metallization 14 can be configured to connect to electrical ground. The IC die 2 can be configured to carry radio frequency (RF) signals, including but not limited to microwave, mm-wave and cm-wave signals. For example, the IC die 2 can operate at one or more frequencies in a range of 1 Hz to 200 GHz, at one or more frequencies in a range of 1 Hz to 100 GHz, or at one or more frequencies in a range of 40 Hz to 95 GHz. In various embodiments, the die 2 can comprise a monolithic microwave or millimeter-wave integrated circuit (MIMIC). The die 2 can comprise a semiconductor die, including any suitable Group III-IV material. For example, the die 2 shown in FIG. 1 comprises a gallium arsenide (GaAs) die. In various embodiments, the die 2 can comprise a wideband millimeter-wave low noise amplifier (LNA) that can accommodate full V- and E-waveguide bands.

The adhesive 8a in FIG. 1 comprises an epoxy (e.g., a conductive epoxy), but any suitable adhesive can be used, such as solder. The package substrate 3 can comprise any suitable type of substrate, such as a laminate substrate (e.g., a printed circuit board, or PCB), an interposer (e.g., a semiconductor interposer with patterned metal), etc. Bond pads 7a on a bottom side of the die 2 can be electrically connected or bonded to corresponding bond pads 7b on a top side of the package substrate 3. For example, in the illustrated embodiment, the adhesive 8a can comprise a conductive material (e.g., a conductive epoxy) that can provide mechanical and electrical connection between the die 2 and the package substrate 3. In addition, the top side of the package substrate 3 can comprise metallization defining a substrate ground plane 13. As shown in FIG. 1, an insulating mask 21 (e.g., a solder mask) can be applied between the die 2 and the package substrate 3, and between the package substrate 3 and the carrier 4, to electrically separate ground metallization from signal metallization. For example, a portion of the insulating mask 21 can be disposed between the pads 7a, 7b and the ground metallization 13, 14.

The package substrate 3 can be mounted to a board or a carrier 4 by way of an adhesive 8b. The adhesive 8b may be the same as or different from the adhesive 8a, such as an epoxy (e.g., conductive epoxy), solder, etc. A feedline 10 (e.g., a radio frequency, or RF, feedline) can be formed on or connected to the carrier 4, and can convey signals to and/or from the package substrate 3. One or more package substrate signal vias 6b can be provided through the package substrate 3 to convey signals to and/or from the IC die 2. Further, the package substrate 3 can comprise one or more ground vias 9 to provide an electrical pathway to ground through the package substrate 3. Further, the IC die can comprise one or more die signal vias 6a (or hot vias) through the die 2 to convey electrical signals between the package substrate 3 and circuitry (e.g., transmission lines, active circuits, etc.) at or near the first or upper side of the die 2, which may comprise the front side of the die 2 having active circuitry. The signal or hot vias 6a can comprise through substrate vias (TSVs) that pass through the die 2.

As shown in FIG. 1, a signal pathway S can extend laterally (e.g., horizontally) along the feedline 10, vertically along the via 6b, laterally along traces or connectors (not shown) at or near the top side of the package substrate 3, vertically along the via 6a of the die, and laterally along the IC die 2. The discontinuities associated with the change of directions from vertical to lateral (or horizontal) and the geometries of the various legs create parasitics and consequent mismatches (e.g., impedance mismatches) that degrade the performance of the IC die. For example, the discontinuities may significantly limit the operational bandwidth of the package 1. Moreover, in some arrangements, the pads 7a, 7b (and, accordingly, the other structures) of the die 2 and package substrate 3 may be misaligned during mounting. In such embodiments, the misalignment can result in variable parasitic capacitance and/or inductance affecting the performance of the package 1 that cannot be calculated before mounting.

Accordingly, in various embodiments, a matching circuit 5 can be provided in the IC die 2. In FIG. 1, the matching circuit 5 can be disposed within the die 2, at or near the first side of the die 2. The matching circuit 5 can be patterned into the IC die with any suitable shapes and dimensions that can accommodate for mismatches and discontinuities (e.g., impedance mismatches) that may occur at the transition between horizontal or lateral lines at the first side of the die 2 and the vertically-disposed signal via 5a. The pattern of the matching circuit 5 can also be suitably designed to compensate for other discontinuities and mismatches, e.g., mismatches between the die 2 and the package substrate 3, and/or mismatches between the package substrate 3 and the carrier. In some embodiments, for example, a matching circuit 5 can be provided within a substrate at the top of a through substrate via (or between the through substrate via and transmission line). In some embodiments, the substrate can comprise the semiconductor substrate of the die 2, such as what is shown in FIG. 1. In such embodiments, as described above, the matching circuit 5 can compensate for discontinuities occurring at or near the top side of the die 2. Further, in some embodiments, the substrate can comprise the package substrate 3. In such embodiments, the matching circuit 5 can compensate for discontinuities occurring at or near the top side of the package substrate 3.

FIG. 2A is a schematic, partially transparent top view of a portion of the IC package 1 of FIG. 1. FIG. 2B is an enlarged view of the package 1 of FIG. 2A that illustrates an example matching circuit 5b according to various embodiments. FIG. 2C is a schematic circuit diagram illustrating an electrical model of the example matching circuit of FIG. 2B. As shown in FIG. 2A, a plurality of matching circuits 5a, 5b can be provided. In some embodiments, one of the matching circuits 5a can be provided along a signal input line, and the other matching circuit 5b can be provided along a signal output line, or vice versa. As shown in FIG. 2A, the matching circuits can be connected by a laterally-extending transmission line 11 at or near the first side (front side in the embodiment) of the die 2. Additional active circuitry may also be provided at or along the first side of the die 2. The die ground metallization 14 at the second side (back side in the embodiment) of the die 2 can significantly overlap the metallization of the ground plane 13 at the upper side of the package substrate 3. As shown in FIGS. 2A-2B, a dielectric gap 15a may be provided between the die ground metallization 14 of the die ground plane and the die pads 7a. Similarly, a dielectric gap 15b can be provided between the ground plane 13 of the package substrate 3 and the substrate pads 7b. The dielectric gaps 15a, 15b can introduce parasitic capacitance and/or inductance along the signal path of the package 1. The matching circuits 5a, 5b can beneficially compensate for the introduced parasitic capacitance and inductance so as to maintain electrical performance and wider operational bandwidth of the package 1.

As shown in FIG. 2B, the matching circuit 5b (and also the circuit 5a) can comprise a generally L-shaped conductive circuit patterned into the die 2. The transmission line 11 can electrically connect to a first inductance matching element 12a of the matching circuit 5b. The first inductance matching element 12a (e.g., first inductance matching circuitry) can correspond to $L_{match}$ of the lumped equivalent circuit model shown in FIG. 2C and can be configured to compensate for parasitic inductances introduced into the die 2. As shown in FIG. 2B, the first inductance matching element 12a can have a width that is less than a width of the transmission line 11. In some embodiments, for example, the width of the first inductance matching element 12a can be between 10% and 80%, or between 40% and 65%, of the width of the transmission line. For example, for a 50 ohm transmission line 11, the width of the transmission line may be in a range of 30 microns to 40 microns (e.g., about 35 microns). In such an embodiment, the width of the first inductance matching element 12a can be in a range of 15 microns to 25 microns (e.g., about 20 microns). In various embodiments, the first inductance matching element 12a can be made longer and/or narrower to increase inductance.

The matching circuit 5b can further comprise a capacitance matching element 12b (e.g., capacitance matching circuitry) configured to compensate for parasitic capacitances introduced into the die 2 by, e.g., the gaps 15a and/or 15b. The capacitance matching element 12b can correspond to $C_{match}$ of the lumped equivalent circuit model shown in FIG. 2C. As shown in FIG. 2B, the capacitance matching element 12b can extend non-parallel or generally transverse to the first inductance matching element 12a. The size (e.g., the area) of the capacitance matching element 12b can be selected so as to provide additional capacitance to compensate for the induced parasitics. In some embodiments, extending the capacitance matching element 12 outwardly from the inductance matching elements 12a, 12c may improve matching since the extended portion of the element 12b may overlay a portion of the ground plane 13 if the die 2 and package substrate 3 are misaligned (see FIGS. 4A-4D below).

The matching circuit 5b can further comprise a second inductance matching element 12c (e.g., second inductance matching circuitry) extending from and connected to the first inductance matching element 12a and the capacitance matching element 12b. As shown, the capacitance matching element 12b can extend as a stub feature from a portion of the second inductance matching element 12c, which can correspond to $L_{feedline}$ of the lumped equivalent circuit model shown in FIG. 2C. As with the first inductance matching element 12a, the width and/or length of the second inductance matching element 12c can be configured to compensate for parasitic inductances and reduce discontinuities. The signal vias 6a can connect to and extend downwardly from the second inductance matching element 12c, and can transfer the signal vertically through the die 2 to the second side (e.g., backside) of the die 2. The inductance of the die signal vias 6a is modeled in FIG. 2C as $L_{hot-via}$. The pads 7a and/or 7b can introduce inductance $L_{pad}$ and capacitance $C_{pad}$, as shown in FIG. 2C. The vias 6b in the package substrate 3 can convey the signals to the carrier 4.

Beneficially, the embodiment shown in FIGS. 2A-2C can improve or maintain the performance of the package 1 when discontinuities, such as horizontal to vertical electrical transitions and vice versa, are provided, as explained above. In various embodiments, the IC die 2 can be configured to operate at a 3 dB bandwidth in a range of 175 GHz to 225 GHz. In some embodiments, an insertion loss between the signal via 6a and the package substrate 3 can be less than about 1 dB from DC to 90 GHz, e.g., less than about 0.5 dB from DC to 90 GHz. In some embodiments, a return loss between the signal via 6a and the package substrate 3 can be greater than about 10 dB from DC to 90 GHz.

FIG. 3A is a top plan view of a matching circuit 5, shown at the top side of the die 2 and overlying the package substrate 3. The matching circuit 5 is similar to the matching circuit 5b of FIGS. 2A-2B. FIG. 3B is a top plan view of a matching circuit 5 according to another embodiment. As with the embodiment of FIGS. 2A-3A, the matching circuit 5 of FIG. 3B can comprise a first inductance matching element 12a, a capacitance matching element 12b, and a second inductance matching element 12c. Further, as with FIGS. 2A-3A, the capacitance matching element 12b can extend non-parallel relative to the first and second inductance matching elements 12a, 12c. Unlike the embodiment of FIGS. 2A-3A, however, the capacitance matching element 12b of FIG. 3B can be disposed in line between the second inductance matching element 12c and the first inductance matching element 12a in the form of a flared section. In the illustrated embodiment, for example, the capacitance matching element 12b can comprise a polygonal (e.g., quadrilateral) flared shape as seen from the top view. The capacitance matching element 12b can comprise a generally trapezoidal flared shape in FIG. 3B. The capacitance matching element 12b can be wider at a first region 28a near the first inductance matching element 12a, and can taper inwardly (e.g., narrower) along a second region 28b nearer the second inductance matching element 12c. Due to the flared shape of the capacitance matching element 12b of FIG. 3B, the degree of overlap of this section with the ground plane 13 of the package substrate 3 below affects the matching circuit capacitance, and thus automatically compensates for variable parasitic capacitance introduced by variable degrees of misalignment in mounting.

FIGS. 3C and 3D are graphs illustrating the electrical performance of the matching circuit 5 of FIGS. 2A-3A (denoted in legend) and of the matching circuit 5 of FIG. 3B (denoted in legend). For example, FIG. 3C compares the return loss associated with the matching circuit 5 of FIG. 3A with the matching circuit 5 of FIG. 3B. FIG. 3D compares the insertion loss associated with the matching circuit of FIG. 3A with the matching circuit 5 of FIG. 3B. As shown in FIGS. 3C and 3D, the matching circuit 5 of FIG. 3B may reduce high frequency losses and may reduce offset sensitivities, as compared with the circuit 5 of FIG. 3A.

FIG. 4A is a top plan view of the matching circuit 5 shown in FIG. 3A. FIG. 4B is a top plan view of the matching circuit 5 shown in FIG. 4A, but offset laterally relative to the ground plane 13 of the package substrate 3 (e.g., laterally offset by 20 microns). Such a lateral offset may result from misalignment that occurs when mounting the die 2 to the package substrate 3. The misalignment can cause the capacitance to vary, as a portion of the matching circuit 5 of FIG. 4B (e.g., the capacitance matching element 12b) may overly the ground plane 13 of the package substrate 3. FIG. 4C is a graph illustrating the return loss of the matching circuit 5 of FIGS. 4A-4B for aligned and misaligned configurations. FIG. 4D is a graph illustrating the insertion loss of the matching circuit 5 of FIGS. 4A-4B for aligned and misaligned configurations. As shown in FIGS. 4C (return losses) and 4D (insertion losses), the performance of the matching circuit 5 (e.g., the insertion and return losses) may be degraded when the die 2 is misaligned relative to the package substrate 3. For example, when the die 2 is offset to the right as shown in FIG. 4B, or to the left, the overall capacitance between the die 2 and package substrate 3 may change. Thus, the matching circuit 5 of FIGS. 4A-4B may be sensitive to misalignments between the die 2 and the package substrate 3.

FIG. 5A is a top plan view of the matching circuit 5 shown in FIG. 3B. FIG. 5B is a top plan view of the matching circuit 5 shown in FIG. 5A, but offset laterally relative to the ground plane 13 of the package substrate 3 (e.g., laterally offset by 20 microns). FIG. 5C is a graph illustrating the return loss of the matching circuit 5 of FIGS. 5A-5B for aligned and misaligned configurations. FIG. 5D is a graph illustrating the insertion loss of the matching circuit 5 of FIGS. 5A-5B for aligned and misaligned configurations. In the embodiment of FIGS. 5A-5B, the flared geometry of the capacitance matching element 12b can reduce the sensitivity of the matching circuit 5 to misalignments of the die 2 relative to the package substrate 3, as compared with the embodiment of FIGS. 4A-4B. For example, the angled or flared shape of the capacitance matching element 12b can gradually or continuously compensate for any lateral misalignments so as to reduce the variability of capacitance between the die 2 and package substrate 3. A comparison of the return losses of FIGS. 4C and 5C indicates that, at an example operating frequency around 90 GHz, the matching circuit 5 of FIGS. 5A-5B maintains operating losses of less than −10 dB, while the matching circuit 5 of FIGS. 4A-4B has higher return losses. Similarly, a comparison of the insertion losses of FIGS. 4D and 5D indicates that a shift of 20 microns at about 90 GHz yields a change in insertion loss for the matching circuit 5 of FIGS. 5A-5B that is less than 0.2 dB. By contrast, as shown in FIG. 4D, a shift of 20 microns at about 90 GHz yields a change in insertion loss for the matching circuit 5 of FIGS. 4A-4B that is greater than 0.2 dB (e.g., about 0.5 dB).

FIG. 6A is a schematic perspective view of the IC die 2 mounted to the package substrate 3, which is mounted to a carrier 4 comprising a probe board. FIG. 6B is a schematic perspective view of the package 1 mounted to the carrier 4. In the embodiment of FIG. 6B, a lid 22 can be mounted to the package substrate 3 over the die 2. An air cavity can be defined by the lid 22 and the package substrate 3. FIG. 6C is a schematic perspective view (shown transparent) illustrating the die 2 mounted to the package substrate 3.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit (IC) die having a first side and a second side opposite the first side, the IC die comprising:
   a signal via through the IC die;
   a transmission line disposed at or near the first side of the IC die, the transmission line configured to transfer an electrical signal to the signal via; and
   a matching circuit disposed at or near the first side within the IC die and providing electrical communication between the transmission line and the signal via,
   wherein the matching circuit comprises a first inductance matching element connected to the transmission line, a capacitance matching element, and a second inductance matching element,
   wherein the matching circuit comprises a flared shape as seen from a top view,
   wherein the capacitance matching element is wider at a first region near the first inductance matching element and tapers inwardly along a second region nearer the second inductance matching element,
   wherein the matching circuit comprising inductance matching circuitry patterned in the IC die to compensate for parasitic inductance and capacitance matching circuitry patterned in the IC die to compensate for parasitic capacitance.

2. The IC die of claim 1, wherein the first side comprises a front active side of the integrated circuit, and wherein the transmission line extends within the IC die laterally along the first side.

3. An integrated circuit (IC) die, the IC die comprising:
   a signal via extending through the IC die;
   a transmission line extending laterally within the IC die in a direction non-parallel to the signal via, the transmission line configured to transfer an electrical signal to the signal via; and
   a matching circuit disposed between the transmission line and the signal via,
   wherein the matching circuit comprises a first inductance matching element connected to the transmission line, a capacitance matching element, and a second inductance matching element,
   wherein the matching circuit comprises a flared shape as seen from a top view,
   wherein the capacitance matching element is wider at a first region near the first inductance matching element and tapers inwardly along a second region nearer the second inductance matching element,
   wherein the matching circuit comprising inductance matching circuitry patterned in the IC die to compensate for parasitic inductance and capacitance matching circuitry patterned in the IC die to compensate for parasitic capacitance.

4. The IC die of claim 3, wherein the IC die is configured to operate at one or more frequencies in a range of 1 Hz to 100 GHz.

5. The IC die of claim 3, wherein the IC die is configured to operate at one or more frequencies in a range of 40 Hz to 95 GHz.

6. The IC die of claim 3, wherein the IC die is configured to operate at a 3 dB bandwidth in a range of 175 GHz to 225 GHz.

7. The IC die of claim 3, wherein the matching circuit is configured to match a first impedance of the signal via with a second impedance of the transmission line.

8. The IC die of claim 3, wherein an insertion loss between the signal via and a package substrate to which the IC die is to be mounted is less than about 1 dB from DC to 90 GHz.

9. The IC die of claim 3, wherein a return loss between the signal via and a package substrate to which the IC die is to be mounted is greater than about 10 dB from DC to 90 GHz.

10. The IC die of claim 3, wherein the matching circuit comprises a generally L-shaped circuit.

11. The IC die of claim 3, wherein the capacitance matching element extends non-parallel outwardly relative to the first inductance matching element and the second inductance matching element.

12. An integrated circuit (IC) package comprising:
   a package substrate; and
   an IC die mounted to the package substrate, the IC die comprising a signal via extending through the IC die and a matching circuit disposed within the IC die and providing electrical communication between circuitry in the IC die and the signal via,
   wherein the matching circuit comprises a first inductance matching element connected to the transmission line, a capacitance matching element, and a second inductance matching element,
   wherein the matching circuit comprises a flared shape as seen from a top view,
   wherein the capacitance matching element is wider at a first region near the first inductance matching element and tapers inwardly along a second region nearer the second inductance matching element,
   wherein the matching circuit comprising inductance matching circuitry patterned in the IC die to compensate for parasitic inductance and capacitance matching circuitry patterned in the IC die to compensate for parasitic capacitance.

13. The IC package of claim 12, wherein the matching circuit is configured to match a first impedance of the signal via with a second impedance of the circuitry.

14. The IC package of claim 12, wherein the package substrate comprises a ground plane, the matching circuit overlying a portion of the ground plane.

15. The IC package of claim 12, wherein the IC die is configured to operate at a 3 dB bandwidth in a range of 175 GHz to 225 GHz.

* * * * *